United States Patent
Nagel et al.

(10) Patent No.: US 11,619,684 B2
(45) Date of Patent: Apr. 4, 2023

(54) MAGNETO COUPLER FOR MAGNETIC COUPLING OF SIGNAL LINES

(71) Applicant: Robert Bosch GmbH, Stuttgart (DE)

(72) Inventors: Joachim Nagel, Reutlingen (DE); Michael Munz, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/670,683

(22) Filed: Feb. 14, 2022

(65) Prior Publication Data

US 2022/0260650 A1   Aug. 18, 2022

(30) Foreign Application Priority Data

Feb. 17, 2021 (DE) ...................... 10 2021 201 489.5

(51) Int. Cl.
*G01R 33/00* (2006.01)
*G01R 33/09* (2006.01)

(52) U.S. Cl.
CPC ....... *G01R 33/0017* (2013.01); *G01R 33/091* (2013.01)

(58) Field of Classification Search
CPC combination set(s) only.
See application file for complete search history.

(56) References Cited

U.S. PATENT DOCUMENTS

| 2011/0316531 | A1* | 12/2011 | Schatz | G01R 33/07 324/244 |
| 2015/0145504 | A1* | 5/2015 | Bai | G01R 33/093 324/207.13 |
| 2017/0227613 | A1* | 8/2017 | Bachleitner Hofmann | H01L 43/08 |
| 2019/0178684 | A1* | 6/2019 | Marauska | G01R 33/0005 |
| 2019/0293733 | A1* | 9/2019 | Esaka | G01R 33/0076 |

* cited by examiner

*Primary Examiner* — Alvaro E Fortich
(74) *Attorney, Agent, or Firm* — Norton Rose Fulbright US LLP; Gerard Messina

(57) ABSTRACT

A magneto coupler for magnetic coupling of signal lines. The magneto coupler includes a circuit board including a first and second electrical connecting devices for connecting a first and second signal lines, respectively, and a semiconductor chip situated on the circuit board. The magneto coupler includes at least one transmitter coil situated in the area of the semiconductor chip, designed to generate a magnetic field based on an electrical signal received via the first electrical connecting device, and a magnetic field-sensitive sensor situated on the semiconductor chip and electrically insulated from the transmitter coil using an insulation barrier, for detecting the magnetic field generated by the transmitter coil and for outputting an electrical signal as a function of the detected magnetic field on the second electrical connecting device. The transmitter coil is situated on the circuit board, while the semiconductor chip is situated above the transmitter coil.

11 Claims, 3 Drawing Sheets

MAGNETO COUPLER FOR MAGNETIC COUPLING OF SIGNAL LINES

FIELD

The present invention relates to a magneto coupler for magnetic coupling of signal lines.

BACKGROUND INFORMATION

Diverse problems often arise when connecting two different electrical devices. Among other things, ground loops are closed by the connection of the electrical devices, which may result in strong interferences of the electrical signals. In particular in sensitive measuring devices or sensors, such interferences may result in errors or even the destruction of the electrical circuits. Furthermore, electrical signals may also be strongly attenuated during a transfer over greater distances, so that initially an amplification of these signals is necessary. This applies in particular in the case of very fast electrical signals. Furthermore, in the case of electrical devices which operate on different voltage levels (for example a first device on a high voltage level and a second device on a low voltage level), in general an electrical isolation of the two devices is necessary to prevent destruction of certain components on the low-voltage side by the high voltage of the first device. The problems mentioned may be solved, among other things, by a galvanic isolation of the signals to be transferred. For this purpose, so-called optocouplers are typically used, which convert the signal on the input side into light and on the output side back into an electrical voltage. Furthermore, capacitive couplers and couplers based on magnetic principles may be used for the galvanic isolation.

For data communication at high speed, particularly fast signal couplers are required, which have a high signal integrity. One of the greatest disadvantages of optocouplers is here, in which the bandwidth is typically limited to 20-30 MHz because of the principle. To expand these limits, there is the option of using magneto couplers, which replace the optical transfer with a magnetic transfer. For this purpose, presently above all monolithic coil GMR systems or monolithic coil TMR systems are used. To achieve a sufficiently high insulation barrier between input and output side in a monolithic design (for example, transient immunity ~10 kV/µs, barrier lifetime ~50000 years), very thick insulation layers are required on the chip for this purpose.

Due to the large number of layers and structuring steps which are required to manufacture the components (coil, GMR/TMR stack, wiring), a relatively complex and costly process results.

In couplers based on magnetic principles, the transmitter coil is thus typically applied in an additional process step to the integrated circuit, which already contains the magnetic receiving elements and the evaluation electronics. To ensure galvanic isolation between the transmitter coil and the magnetic receiving elements, this concept requires an additional deposition step on a previously applied insulation layer. These additional process steps for applying the insulation layer and the transmitter coil represent an additional expenditure and are thus linked to higher process costs.

SUMMARY

An object of the present invention is to provide a possibility for simplifying the manufacturing of a coupler based on magnetic principles. This object may be achieved with the aid of the present invention. Advantageous embodiments of the present invention are disclosed herein.

According to an example embodiment of the present invention, a magneto coupler for magnetic coupling of signal lines is provided, which includes a circuit board including a first electrical connecting device for connecting a first signal line and a second electrical connecting device for connecting a second signal line, and a semiconductor chip situated on the circuit board. The magneto coupler furthermore includes a transmitter coil situated in the area of the semiconductor chip and designed to generate a magnetic field as a function of an electrical signal received via the first electrical connecting device and a magnetic field-sensitive sensor, which is situated on the semiconductor chip and is electrically insulated from the transmitter coil with the aid of an insulation barrier, for detecting the magnetic field generated by the transmitter coil and for outputting an electrical signal as a function of the detected magnetic field on the second electrical connecting line. The transmitter coil is formed on the circuit board, while the semiconductor chip is situated above the transmitter coil. In comparison to previously existing monolithic approaches, simpler manufacturing processes and thus reduced process costs result in the present invention described here. This relates above all to the manufacturing of the insulation barrier (thick oxide) and the manufacturing of the transmitter coil.

In one specific embodiment of the present invention, it is provided that the insulation barrier includes an oxide layer formed on the lower side of the semiconductor chip. The insulation barrier may be adapted relatively easily for the particular application by varying the thickness of such an oxide layer.

In another specific embodiment of the present invention, it is provided that the semiconductor chip is formed in the form of an SOI chip including a rear side oxide situated on the lower side of the semiconductor chip, and the insulation barrier includes the rear side oxide of the semiconductor chip. This procedure offers the advantage that relatively thick rear side oxide is already present in the silicon-on-insulator chip, so that a sufficiently thick insulation barrier may therefore also be implemented without further insulation layers.

In another specific embodiment of the present invention, it is provided that the insulation barrier includes an insulation structure made of an electrically insulating material, which is situated between the transmitter coil and the semiconductor chip.

This procedure represents a particularly advantageous approach, since an insulation structure may be provided very cost-effectively in arbitrary thicknesses, so that the insulation barrier may also be implemented without further insulation layers. The manufacturing of the insulation barrier may thus be displaced completely into the packaging process, due to which the manufacturing process may be simplified and the manufacturing costs may be reduced.

In another specific embodiment of the present invention, it is provided that the insulation barrier includes an adhesive compound situated between the transmitter coil and the semiconductor chip. With the aid of the adhesive compound, a sufficiently thick insulation barrier may be created without additional method steps. The manufacturing method may thus be simplified, which also results in a reduction of the manufacturing costs. The layer thickness of the insulation barrier may thus be adapted very easily by using different amounts of the adhesive compound.

In another specific embodiment of the present invention, it is provided that the transmitter coil and/or the magnetic field-sensitive sensor are made gradiometric. With the aid of this design, a magneto coupler which is particularly resistant to interference with respect to external magnetic interfering fields may be implemented.

In another specific embodiment of the present invention, it is provided that the magnetic field-sensitive sensor includes multiple sensor elements arranged adjacent to one another. This design enables a particularly effective gradiometric magneto coupler. Since the sensor elements are manufactured in a shared process on the semiconductor chip, the manufacture of such a gradiometric sensor does not require additional method steps.

In another specific embodiment of the present invention, it is provided that the magnetic field-sensitive sensor includes at least one sensor element based on the principle of tunnel magnetoresistance and/or at least one sensor element based on the principle of giant magnetoresistance. Such sensor elements enable a particularly high bandwidth with high sensitivity for magnetic fields at the same time. Particularly fast magneto couplers may thus be manufactured.

In another specific embodiment of the present invention, it is provided that the semiconductor chip furthermore includes an evaluation circuit designed to evaluate the magnetic field detected with the aid of the sensor and to generate an electrical signal as a function of the magnetic field on the second connecting line. The arrangement of the evaluation circuit on the semiconductor chip enables a particularly small overall size of the magneto coupler. Furthermore, interferences of the measuring signals may be reduced by the short signal paths thus implemented between the sensor elements and the evaluation circuit, which results in an improved signal-to-noise ratio.

According to a further aspect of the present invention, a method for manufacturing the above-described magneto coupler is furthermore provided, in which initially a circuit board is provided and subsequently a transmitter coil is formed on the circuit board. In accordance with an example embodiment of the present invention, a semiconductor chip which includes a magnetic field-sensitive sensor and an evaluation circuit is subsequently situated on the circuit board in an area above the transmitter coil. An insulation barrier is created between the transmitter coil and the magnetic field-sensitive sensor, which includes at least one rear side oxide situated on the lower side of the semiconductor chip, an insulation structure made of an electrically insulating material, which is situated between the transmitter coil and the semiconductor chip, and/or an adhesive compound situated between the transmitter coil and the semiconductor chip. This method may be integrated particularly well into the land grid array (LGA) process. Furthermore, the advantages already mentioned in conjunction with the magneto coupler result for the method.

In one specific embodiment of the present invention, it is provided that the method includes the following steps, namely adhesively bonding the insulation structure on the circuit board including the transmitter coil situated thereon and adhesively bonding the semiconductor chip on the insulation structure. The use of adhesive offers a particularly simple and cost-effective option for fastening the components on the circuit board. Furthermore, the required insulation barrier may be manufactured or an existing insulation barrier may be expanded with the aid of the adhesive compound made of an electrically insulating material, which is situated between the transmitter coil and the semiconductor chip.

The present invention is described in greater detail hereinafter on the basis of figures.

DETAILED DESCRIPTION OF EXAMPLE EMBODIMENTS

The present invention described here provides simplifying the manufacture of a monolithic approach for magneto couplers, in that the input coil of the monolithic approach is displaced into the packaging concept. An LGA (land grid array) packaging concept is preferably used for this purpose. It is provided that the insulation barrier required between transmitter coil and sensor is displaced away from previously used monolithic on-chip approaches toward electrical insulation achievable by packaging.

This is achieved by the separation of at least one transmitter or coupling coil on the circuit board of the LGA housing and a sensor element (TMR/GMR sensor) on a silicon chip in the LGA housing. An insulating chip adhesive or a rear side oxide on a wafer (for example, SOI wafer) may preferably be used as the insulation barrier.

Figure 1:
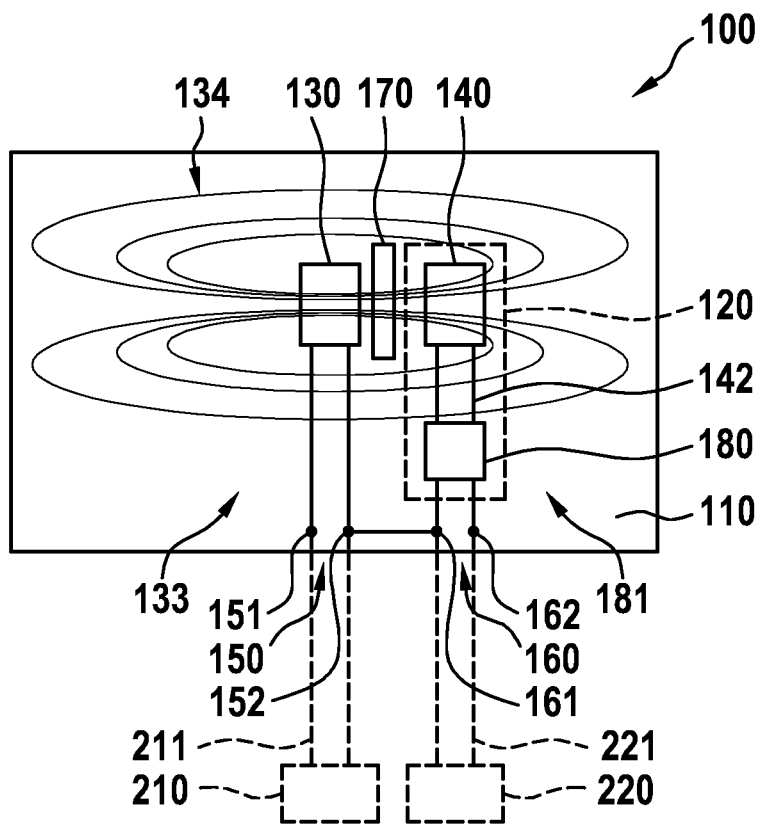
FIG. 1 schematically shows the structure of a magneto coupler according to an example embodiment of the present invention.

FIG. 1 shows a greatly simplified illustration of magneto coupler 100 according to the present invention. Magneto coupler 100 includes a circuit board 110, on which a transmitter coil 130 and a magnetic field-sensitive sensor 140 formed on a semiconductor chip 120 are situated. Transmitter coil 130 is connected via suitable connecting lines 133 to a first connecting device 150 of magneto coupler 100, which in the present example includes two terminals 151, 152 for connecting an external signal line 211 of a first circuit 210. During operation of magneto coupler 100, transmitter coil 130 converts an electrical signal externally supplied via first connecting device 150 into a temporally varying magnetic field 134. Sensor 140 situated in magnetic field 134 of transmitter coil 130 is electrically insulated from transmitter coil 130 with the aid of an insulation barrier 170 indicated here. As is apparent from FIG. 1, sensor 140 is situated on a separate semiconductor chip 120 and connected with the aid of corresponding connecting lines 142 to a second connecting device 160 of magneto coupler 100, which also includes two terminals 161, 162 and is used to connect a signal line 221 of a second circuit 220 independent (electrically decoupled) from first circuit 210. Signal lines 111, 221 and circuits 210, 220 are indicated in FIG. 1 with the aid of dashed lines. Sensor 140 is preferably connected to external connecting device 160 via an evaluation circuit 180, which evaluates the sensor signals of sensor 140 and outputs corresponding electrical signals at second connecting device 160. Evaluation circuit 180, which is also typically designed in the form of an integrated circuit on semiconductor chip 120, is connected via suitable signal lines 181 to second connecting device 160. According to the present invention, transmitter coil 130 is not situated on semiconductor chip 120 but as a separate component on circuit board 110.

Figure 2:
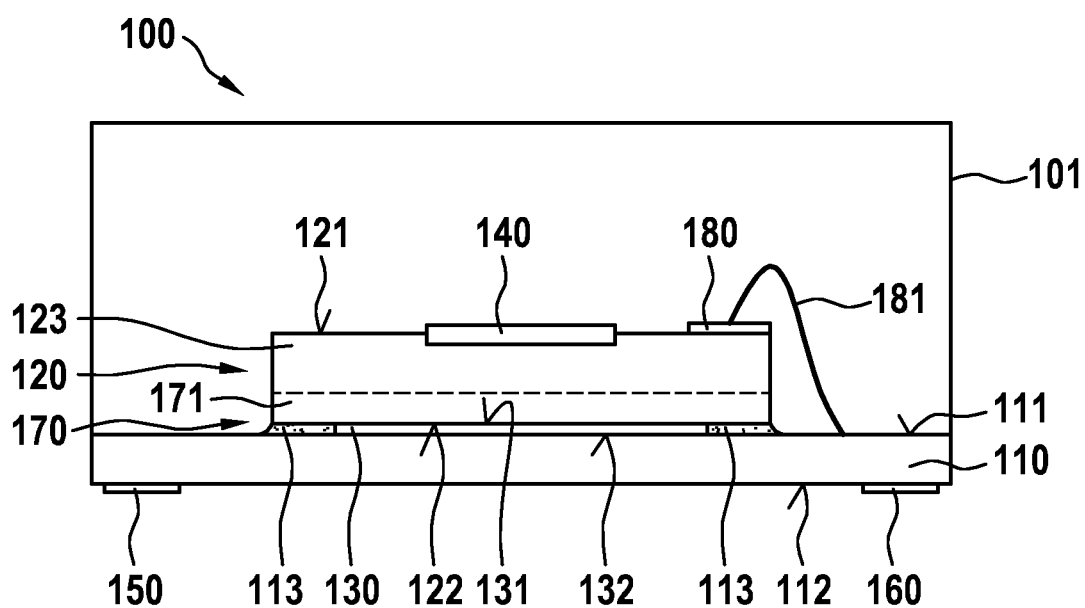
FIG. 2 schematically shows a cross section through a magneto coupler designed according to a second specific embodiment of the present invention including a rear side oxide used as an insulation barrier.

As is shown in FIG. 2, which shows a cross-sectional illustration through a magneto coupler 100 according to a first specific embodiment of the present invention, magneto coupler 100 is constructed, for example, according to the LGA principle (land grid array). In this packaging technology, the components are installed directly on circuit board 110 and electrically connected to corresponding connecting structures 150, 160 on lower side 112 of circuit board 110. Depending on the application, the fully installed components may subsequently also be provided with a suitable housing 101. Transmitter coil 130 is formed on upper side 111 of circuit board 110 and electrically connected via electrical lines (not shown here) to first electrical connecting device 150 of magneto coupler 100, which is situated in the present example on lower side 112 of circuit board 110. Transmitter coil 130 may be created in any suitable way on circuit board 110, for example, by structuring a metallization layer situated on circuit board 110. Furthermore, it is also possible to attach an already fully structured transmitter coil on upper side 111 of circuit board 110, for example with the aid of an adhesive.

FIG. 2 furthermore shows that semiconductor chip 120, on which sensor 140 including evaluation circuit 180 is formed, is mounted on circuit board 110 in an area above transmitter coil 130. Semiconductor chip 120 is fastened on upper side 111 of circuit board 110, for example, with the aid of a suitable adhesive compound 113. As FIG. 2 furthermore shows, evaluation circuit 180 is electrically connected with the aid of bond wires 181 to corresponding electrical conductor structures (not shown here) of circuit board 110, which form an electrical connection to connecting device 160 of magneto coupler 100, which is situated in the present example on lower side 112 of circuit board 110.

In the exemplary embodiment shown here, semiconductor chip 120 includes an oxide layer 171 on its lower side 122, which was created by oxidation of semiconductor material 123 in the affected area. This oxide layer 171 forming a rear side oxide is used as an insulation barrier 170 for electrical insulation of the first electrical circuit connected to transmitter coil 130 and the second electrical circuit connected to sensor 140. Due to the generally relatively low thickness of such oxide layers 171, an insulation barrier 170 thus formed may be advantageous in particular in applications in which only small electrical potential differences are to be expected between the two electrical circuits. Such a rear side oxide 171 may be manufactured relatively easily and cost-effectively.

For applications in which the electrical potentials of the two circuits have greater differences, it may be necessary to create an insulation barrier 170 having a significantly greater layer thickness. In this case, it may be advantageous to make use of a so-called SOI semiconductor chip. As shown by way of example in FIG. 3, such an SOI semiconductor chip 120 includes a silicon substrate 123, which was deposited on a relatively thick oxide layer 171. Oxide layer 171 forming the rear side oxide of semiconductor chip 120 is generally manufactured by depositing silicon dioxide and thus may be created relatively easily and cost-effectively in a relatively large layer thickness.

Figure 4:
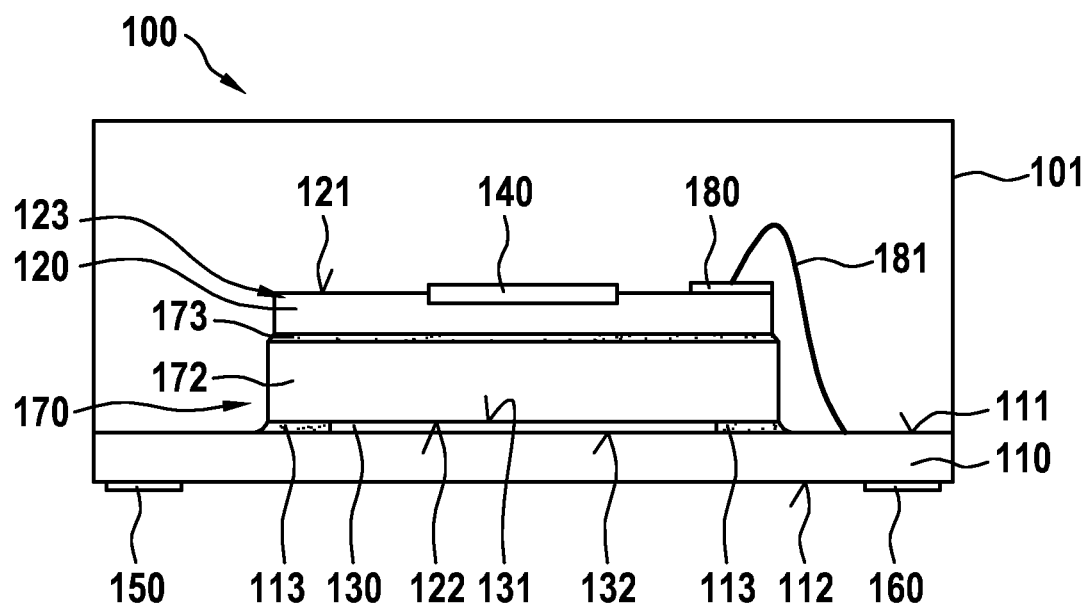
FIG. 4 schematically shows a cross section through a magneto coupler designed according to a third specific embodiment of the present invention including an insulation structure situated between transmitter coil and semiconductor chip.

Alternatively to an oxide layer 171 situated on lower side 122 of semiconductor chip 120, insulation barrier 170 may also be formed by at least one electrical insulator situated between transmitter coil 130 and semiconductor chip 120. For this purpose, FIG. 4 shows a corresponding specific embodiment of magneto coupler 100 according to the present invention having an insulation structure 172 made of an electrically insulating material situated on upper side 131 of transmitter coil 130. As is furthermore apparent from FIG. 4, semiconductor chip 120 is located on the upper side of insulation structure 172, in the present example, an electrically insulating adhesive compound 173 being used to fasten semiconductor chip 120 on insulation structure 172. In principle, any suitable electrically insulating solid comes into consideration as the material for insulation structure 172, for example a polymer. Since insulation structure 172 may be manufactured particularly easily in any arbitrary layer thickness, particularly thick insulation barriers 170 may thus also be manufactured cost-effectively particularly easily.

Alternatively to the exemplary embodiment shown in FIG. 4, electrically insulating adhesive compound 173 below semiconductor chip 120 may also be formed in a significantly greater layer thickness, so that the thickness of insulation structure 172 may be reduced. If the electrical insulation achieved by adhesive compound 173 is sufficient for the particular application, the use of a separate insulation structure 172 may also be totally omitted. In such a case, insulation barrier 170 is solely made of adhesive compound 173 (not shown here).

Figure 3:
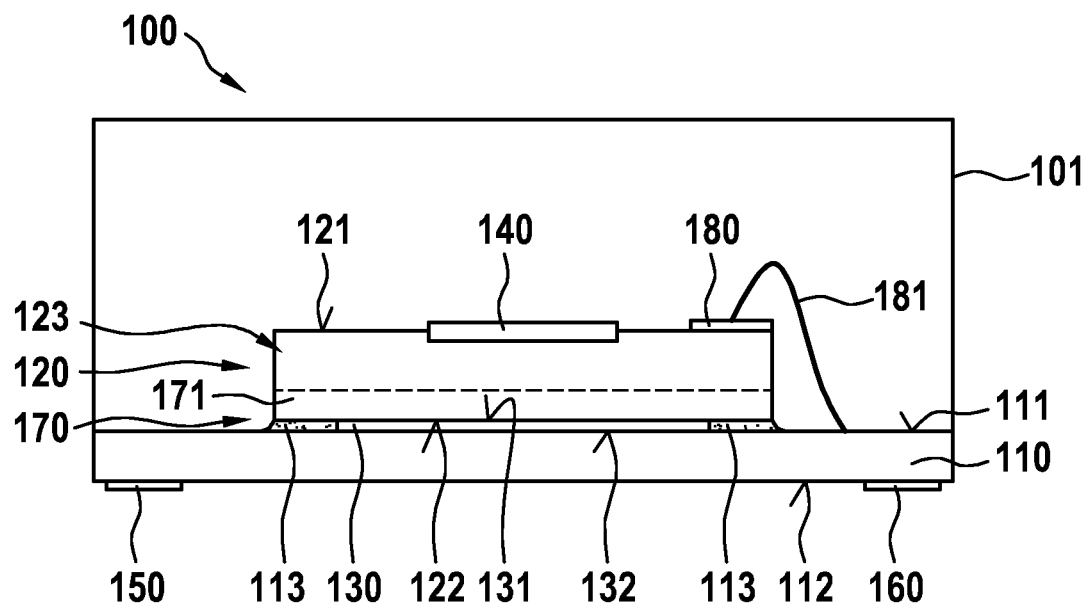
FIG. 3 schematically shows a cross section through a magneto coupler designed according to a second specific embodiment of the present invention including an SOI rear side oxide used as an insulation barrier.

Insulation barrier 170 may also be constructed from multiple electrically insulating layers, the embodiments shown in FIGS. 2, 3, and 4 also being able to be combined with one another. An insulation barrier 170 may thus be manufactured, for example, which in addition to an oxide layer 171 situated on the rear side on semiconductor chip 120 also includes a separate insulation structure 172. Furthermore, adhesive compounds 113, 173, using which components 120, 130, 172 are fastened on circuit board 110 or on one another, may also form a part of insulation barrier 170. This process offers the advantage that such adhesive compounds may in principle be applied in any thickness, so that corresponding insulation barriers 170 may thus be created relatively easily and cost-effectively even with particularly large layer thicknesses. In addition to the case described in conjunction with FIG. 4, in which electrically insulating adhesive compound 173 together with insulation structure 172 forms desired insulation barrier 170, insulation barrier 170 may also be formed from electrically insulating adhesive compound 173 and an oxide layer 171 situated on the lower side of semiconductor chip 120.

Figure 5:
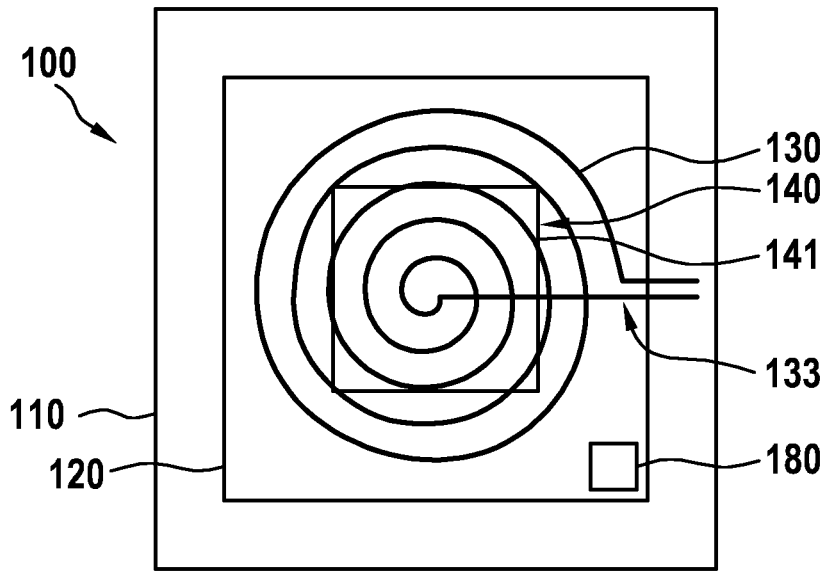
FIG. 5 schematically shows a top view of a magneto coupler including a magnetic field-sensitive sensor including a single sensor element, in accordance with an example embodiment of the present invention.

In magneto coupler 100 described here, sensor 140 is preferably situated directly above transmitter coil 130. In this regard, FIG. 5 schematically shows a top view of magneto coupler 100 shown by way of example in FIG. 2. In the present example, transmitter coil 130 includes an electrical conductor structure extending in the form of a snail shell, whose end sections are each connected to one of two connecting lines 133. As is furthermore apparent from FIG. 5, in the present case a sensor 140 only includes one sensor element 141, which is situated essentially above the center of transmitter coil 130. As is furthermore apparent here, evaluation circuit 180, which is formed together with sensor element 141 on semiconductor chip 120, is preferably located in an edge area of semiconductor chip 120.

Figure 6:
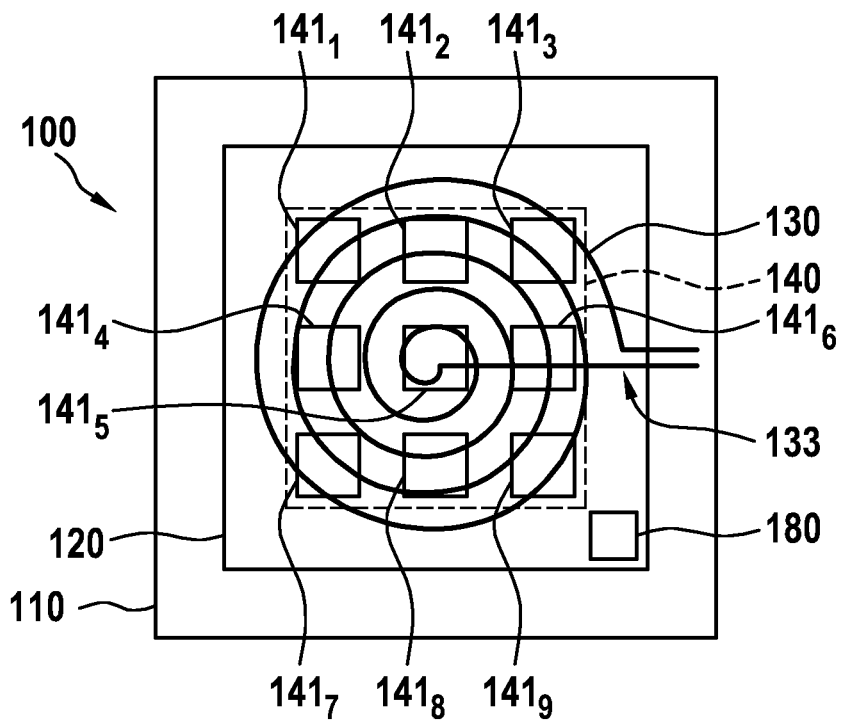
FIG. 6 schematically shows a top view of a magneto coupler including a magnetic field-sensitive sensor with a gradiometric design and including multiple sensor elements, in accordance with an example embodiment of the present invention.

In addition to the arrangement shown in FIG. 5, other concepts may also be implemented in principle for the sensing of the magnetic field generated by transmitter coil 130. Sensor 140 may thus be designed to be gradiometric, for example, due to which the system may be made very robust in relation to external magnetic interferences (for example the so-called common mode interferences). Such a sensor 140 may be implemented, for example, with the aid of multiple sensor elements arranged adjacent to one another. For this purpose, FIG. 6 shows a specific embodiment of magneto coupler 100 including a sensor 140 made up of a total of nine sensor elements $141_1$ through $141_9$, which are situated distributed in the form of a matrix over nearly the entire area of transmitter coil 130. In this arrangement, different sensor elements $141_1$ through $141_9$ each sense a different sized portion of the magnetic field generated by transmitter coil 130. Since all sensor elements $141_1$ through $141_9$ are subject to essentially the same external influence of external magnetic interference sources, however, such external interference fields may be detected and removed from the actual measuring signal by a common evaluation of the sensor signals of multiple sensor elements $141_1$ through $141_9$.

In principle, the gradiometric function of magneto coupler 100 may also be implemented with the aid of a single sensor element and multiple transmitter coils or using a combination of multiple transmitter coils and multiple sensor elements (not shown here).

Although the present invention was illustrated and described in greater detail by the preferred exemplary embodiments, the present invention is not restricted by the disclosed examples. Rather, other variations may also be derived therefrom by those skilled in the art in view of the disclosure herein, without departing from the scope of protection of the present invention.

What is claimed is:

1. A magneto coupler for magnetic coupling of signal lines, comprising:
    a circuit board including a first electrical connecting device for connecting a first signal line, and a second electrical connecting device for connecting a second signal line;
    a semiconductor chip situated on the circuit board;
    at least one transmitter coil, which is situated in an area of the semiconductor chip, configured to generate a magnetic field as a function of an electrical signal received via the first electrical connecting device; and
    a magnetic field-sensitive sensor, which is situated on the semiconductor chip and electrically insulated from the transmitter coil via an insulation barrier, the magnetic field-sensitive sensor configured to detect the magnetic field generated by the transmitter coil and to output an electrical signal, as a function of the detected magnetic field, on the second electrical connecting device;
    wherein the transmitter coil is situated on the circuit board, and the semiconductor chip is situated above the transmitter coil.

2. The magneto coupler as recited in claim 1, wherein the insulation barrier includes an oxide layer formed on a lower side of the semiconductor chip.

3. The magneto coupler as recited in claim 1, wherein the semiconductor chip is an SOI chip including a rear side oxide situated on the lower side of the semiconductor chip, and the insulation barrier includes the rear side oxide of the semiconductor chip.

4. The magneto coupler as recited in claim 1, wherein the insulation barrier includes an insulation structure which is situated between the transmitter coil and the semiconductor chip, and is made of an electrically insulating material.

5. The magneto coupler as recited in claim 1, wherein the insulation barrier includes an adhesive compound situated between the transmitter coil and the semiconductor chip.

6. The magneto coupler as recited in claim 1, wherein the transmitter coil and/or the magnetic field-sensitive sensor have a gradiometric configuration.

7. The magneto coupler as recited in claim 6, wherein the magnetic field-sensitive sensor includes multiple sensor elements arranged adjacent to one another.

8. The magneto coupler as recited in claim 1, wherein the magnetic field-sensitive sensor includes at least one sensor element) based on tunnel magnetoresistance and/or at least one sensor element based on giant magnetoresistance.

9. The magneto coupler as recited in claim 1, wherein the semiconductor chip includes an evaluation circuit configured to evaluate the magnetic field detected using the sensor and to generate an electrical signal, as a function of the magnetic field, on the second connecting device.

10. A method for manufacturing a magneto coupler, comprising the following steps:
    providing a circuit board;
    forming a transmitter coil on the circuit board; and
    arranging a semiconductor chip, which includes a magnetic field-sensitive sensor and an evaluation circuit, on the circuit board in an area above the transmitter coil;
    wherein an insulation barrier is created between the transmitter coil and the magnetic field-sensitive sensor, which at least includes:
        a rear side oxide situated on a lower side of the semiconductor chip, and/or
        an insulation structure, which is situated between the transmitter coil and the semiconductor chip, made of an electrically insulating material, and/or
        an adhesive compound situated between the transmitter coil and the semiconductor chip.

11. The method as recited in claim 10, wherein the method further comprises:
    adhesively bonding the insulation structure on the circuit board including the transmitter coil situated on the circuit board; and
    adhesively bonding the semiconductor chip on the insulation structure.

* * * * *